US007955989B2

(12) United States Patent
Barr et al.

(10) Patent No.: US 7,955,989 B2
(45) Date of Patent: Jun. 7, 2011

(54) TEXTURING SEMICONDUCTOR SUBSTRATES

(75) Inventors: Robert K. Barr, Shrewsbury, MA (US); Corey O'Connor, Worcester, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 12/887,873

(22) Filed: Sep. 22, 2010

(65) Prior Publication Data
US 2011/0081742 A1 Apr. 7, 2011

Related U.S. Application Data

(60) Provisional application No. 61/277,409, filed on Sep. 24, 2009.

(51) Int. Cl.
*H01L 21/461* (2006.01)
*H01L 31/00* (2006.01)
*C25F 3/00* (2006.01)
*C11D 7/32* (2006.01)

(52) U.S. Cl. ............... 438/745; 257/E21.309; 136/256; 216/99; 510/524

(58) Field of Classification Search .................. 438/745; 136/256; 510/175, 524; 219/99; 257/E21.309
See application file for complete search history.

(56) References Cited

U.S. PATENT DOCUMENTS

| | | | | |
|---|---|---|---|---|
| 3,998,659 A * | 12/1976 | Wakefield | ..................... | 136/250 |
| 4,137,123 A * | 1/1979 | Bailey et al. | ................... | 438/753 |
| 5,431,777 A * | 7/1995 | Austin et al. | ................... | 438/753 |
| 6,197,611 B1 * | 3/2001 | Nishimoto | ..................... | 438/57 |
| 6,451,218 B1 * | 9/2002 | Holdermann | ................... | 216/99 |
| 6,506,717 B1 * | 1/2003 | Kott et al. | ..................... | 510/357 |
| 6,544,599 B1 * | 4/2003 | Brown et al. | ................... | 427/475 |
| 2009/0252691 A1 * | 10/2009 | Gartstein et al. | ................ | 424/49 |
| 2010/0248494 A1 * | 9/2010 | Barr et al. | ..................... | 438/745 |

* cited by examiner

*Primary Examiner* — W. David Coleman
(74) *Attorney, Agent, or Firm* — John J. Piskorski

(57) ABSTRACT

Semiconductors are textured with aqueous solutions containing non-volatile alkoxylated glycols, their ethers and ether acetate derivatives having molecular weights of 170 or greater and flash points of 75° C. or greater. The textured semiconductors can be used in the manufacture of photovoltaic devices.

9 Claims, 2 Drawing Sheets

TEXTURING SEMICONDUCTOR SUBSTRATES

This application claims the benefit of priority under 35 U.S.C. §119(e) to U.S. Provisional Application No. 61/277,409, filed Sep. 24, 2009, the entire contents of which application are incorporated herein by reference.

The present invention is directed to a method of texturing semiconductor substrates with an aqueous solution including non-volatile, high molecular weight alkoxylated glycols and their ether and ether acetate derivatives. More specifically, the present invention is directed to a method of texturing semiconductor substrates with an aqueous solution including non-volatile, high molecular weight alkoxylated glycols and their ether and ether acetate derivatives to reduce light reflectance from the semiconductor substrates.

A textured semiconductor surface reduces reflection across wide bands of incident light thereby increasing absorbed light intensity. Such semiconductors may be used in the manufacture of solar cells. Solar cells are devices that convert light energy incident on their surfaces such as sunlight into electric energy. Reducing the reflectance of light incident on the surface improves conversion efficiency into electric energy. Texturing, however, is not restricted to semiconductors in the manufacture of solar cells but also may be used in the manufacture of photovoltaic devices in general, optical and electrochemical detectors/sensors, biodetectors/biosensors, catalysts, electrodes, and other devices where reducing the reflectance of incident light improves the efficiency of the device.

Known techniques for wet chemical pyramidal (tetragonal) structure texturing of (100)-orientated silicon surfaces use alkaline media, such as solutions of alkali hydroxides, alkali carbonates, ammonia or choline. Alkali hydroxides by themselves produce unevenly textured surfaces which result in areas of high reflectivity. An additive is necessary to control the texturing rate and to form repeatable pyramid structures. Solutions of hydrazine or ethylene diamine or pyrocatechol can also be used but they are disadvantageous on account of their toxicity to workers. The most common formulations include water, sodium or potassium hydroxide and alcohol. The alcohol component used is either ethylene glycol or isopropanol.

A method based on a texturing solution that contains ethylene glycol is described in EP 0477424A1. The texturing solution used includes water, potassium hydroxide, ethylene glycol and silicon. Oxygen is also added as a further component. After the silicon surface has undergone wet chemical structural texturing, reproducibly uniform pyramids are obtained by aerating the texturing solution with oxygen. The pyramid height can be varied by the aerating duration of the texturing solution. Introducing oxygen over a longer period, i.e. greater oxidation of the glycol, results in smaller pyramids. Pyramid sizes of 2 µm or less can be produced. A disadvantage of this formulation is that the texturing solution cannot be used ad hoc because it requires dissolution of silicon prior to application. Studies have shown that a subsequent rest phase of several hours is needed for formation of smooth (111) faces. Simply adding silicate to the solution does not lead to the beneficial results.

U.S. Pat. No. 3,998,659 discloses a wet texturing method based on isopropanol (IPA). In contrast to texturing with a solution based on ethylene glycol, an IPA based solution can be used immediately for texturing. This texturing solution can be used with and without silicate. In general, such texturing is done at temperatures of around 80° C. for periods of 10 minutes to 30 minutes. This results in a high rate of evaporation of IPA because of IPA's boiling point of 82° C. IPA is also very volatile having a flash point of 12° C. This results in problems with regard to uniform texturing and reproducibility of the pyramidal structures as well as an enormous consumption of IPA. Non-uniform texturing of a semiconductor substrate results in increased incident light reflectance. Reproducibility is important to reduce the probability of defective products and provide reliable and efficient manufacturing, thus reducing costs to both consumers and manufacturers. The high consumption of IPA also adds to the high manufacturing costs and in high waste disposal costs for the spent chemicals. Also, in general, such IPA systems tend to have reflectance of 14% to 27% in the incident light wavelength range of 360 nm to 750 nm. Ideally, reflectance in this wavelength range is 13% to 14%.

U.S. Pat. No. 6,451,218 discloses an alternative texturing solution which includes an alkaline reagent, IPA and alkaline ethylene glycol. The patent alleges that the solution provides good texturing reproducibility and that the pyramid size is adjustable. It also alleges that the formulation does not suffer from as great an evaporation rate of IPA as conventional IPA solutions, thus reducing the frequency of having to replace the solution during texturing. However, although there are texturing solutions which may provide texturing reproducibility and reduced evaporation of solution components, there is still a need for a texturing solution with improved texturing uniformity, reproducibility, reduced evaporation of components and improved reflectance performance.

In one aspect a method includes providing a semiconductor substrate; and applying an aqueous solution including one or more compounds chosen from alkoxylated glycols, their mono-methyl ether and mono-methyl ether acetate derivatives with a weight average molecular weight of 170 gm/mole or greater and a flash point of 75° C. or greater, and one or more alkaline compounds to the semiconductor substrate to texture the semiconductor substrate.

In another aspect a method includes providing a semiconductor substrate; texturing a surface of the semiconductor substrate with an aqueous solution comprising one or more compounds chosen from alkoxylated glycols, their mono-methyl ether and mono-methyl ether acetate derivatives with a weight average molecular weight of 170 gm/mole or greater and a flash point of 75° C. or greater, and one or more alkaline compounds; doping the semiconductor substrate to form a p/n junction; depositing an anti-reflective layer on the textured surface; selectively etching the anti-reflective layer to expose portions of the textured surface to form a pattern; and depositing one or more metal layers on the exposed portions of the textured surface to form current tracks.

The method provides uniform texturing as well as reproducibility of pyramid structure formation on semiconductors. This results in reduced incident light reflectance and improved conversion efficiency of incident light into electric energy. In addition, the aqueous solutions used to texture the semiconductor substrates have components with high flash points in contrast to components used in conventional texturing solutions, thus preventing substantial evaporation of solution components. Accordingly, the texturing solutions may be used over longer periods of time than many conventional texturing solutions. This reduces downtime for manufacturing processes and reduces the frequency of solution replacement, thus improving the overall efficiency of the texturing method. This improved efficiency of the method reduces costs to both consumers and manufactures alike.

The method may be used to texture semiconductors for photovoltaic devices in general, including semiconductors in the manufacture of solar cells. The method also may be used to texture semiconductors in the manufacture of optical and electrochemical detectors/sensors, biodetectors/biosensors, catalysts, electrodes, gate electrodes, ohmic contacts, interconnection lines, Schottky barrier diode contacts, optoelectronic components and other articles where reducing the reflectance of incident light improves the efficiency of the device.

Figure 1:
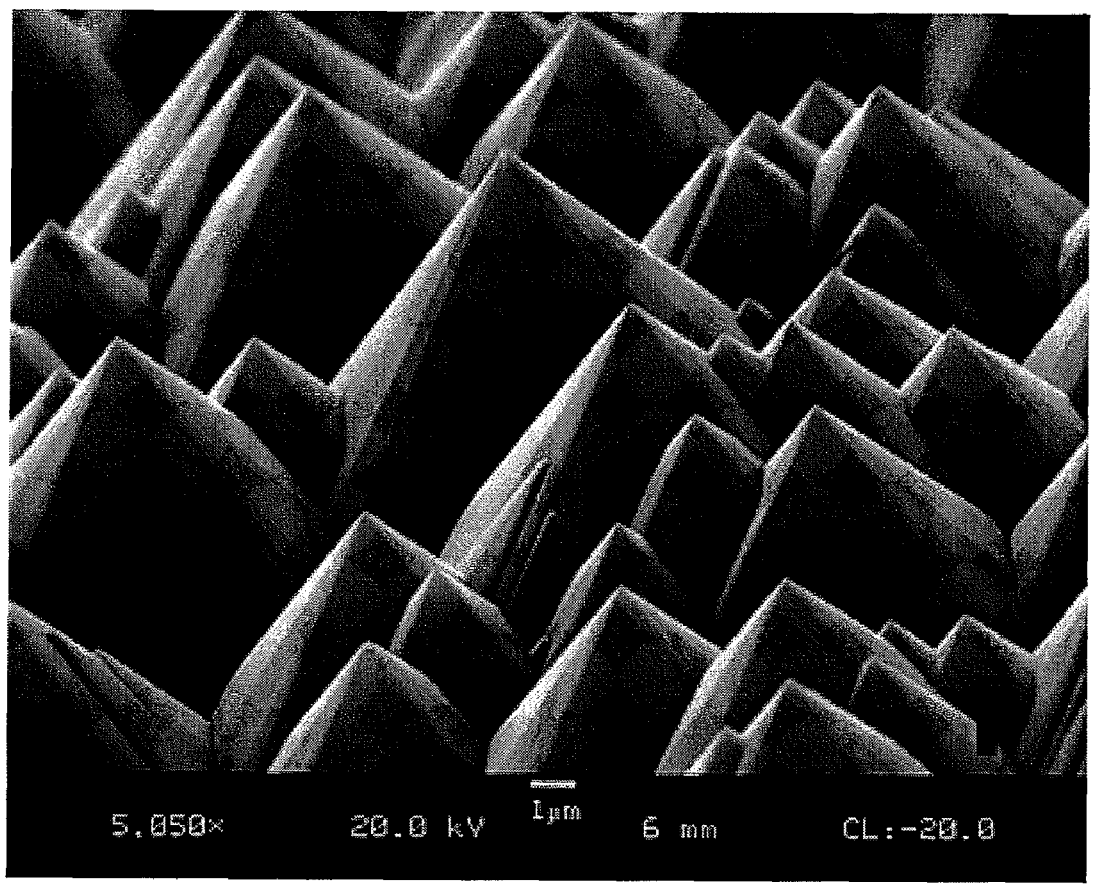
FIG. 1 is a 5000×SEM of a textured surface of a polysilicon wafer showing pyramid structures formed with a solution of the invention.

As used throughout this specification, the terms "depositing" and "plating" are used interchangeably. The terms "current tracks" and "current lines" are used interchangeably. The terms "composition" and "bath" are used interchangeably. The indefinite articles "a" and "an" are intended to include both the singular and the plural. The term "selectively depositing" means that deposition occurs at specific desired areas on a substrate. The term "flash point" means the lowest temperature at which the vapor of a combustible liquid can be ignited in air. The team "lux=lx" is a unit of illumination equal to one lumen/m$^2$; and one lux=1.46 milliwatts of radiant electromagnetic (EM) power at a frequency of 540 tetrahertz. The unit "dynes" is a centimeter-grams-second unit of force. The following abbreviations have the following meanings unless the context clearly indicates otherwise: ° C.=degrees Celsius; g=grams; mL=milliliter; L=liter; A=amperes; m=meters; dm=decimeter; cm=centimeter; μm=microns; nm=nanometers; min.=minutes; SEM=scanning electron micrograph; UV=ultraviolet; and IR=infrared. All percentages and ratios are by weight unless otherwise indicated. All ranges are inclusive and combinable in any order except where it is logical that such numerical ranges are constrained to add up to 100%.

Aqueous solutions for texturing semiconductor substrates include one or more compounds chosen from alkoxylated glycols, their mono-methyl ether and mono-methyl ether acetate derivatives having a weight average molecular weight of 170 g/mole or greater and a flash point of 75° C. or greater, and one or more alkaline compounds. Typically, the weight average molecular weight of the alkoxylated glycols, their mono-methyl ether and mono-methyl ether acetate derivatives range from 170 g/mole to 4000 g/mole, more typically from 190 g/mole to 500 g/mole. Flash points typically range from 75° C. to 300° C. or such as from 100° C. to 300° C. More typically, flash points range from 140° C. to 200° C. Alkoxylated glycols, their mono-methyl ether and mono-methyl ether acetate derivatives used in the aqueous texturing solutions are either water-soluble or at least water-miscible. The aqueous solutions provide uniform texturing as well as reproducibility of pyramid structure formation on semiconductors. This results in reduced incident light reflectance and improved conversion efficiency of incident light into electric energy. The flash points of 75° C. or greater provide non-volatile texturing solutions preventing substantial evaporation of solution components. In addition, the alkoxylated glycols, their mono-methyl ether and mono-methyl ether acetate derivatives with boiling points of 190° C. or greater further reduce the amounts of lost components at operating temperatures. Accordingly, the texturing solutions may be used over longer periods of time than many conventional texturing solutions. This reduces downtime for manufacturing processes and reduces the frequency of solution replacement, thus improving the overall efficiency of the texturing method. This improved efficiency of the method reduces costs to both consumers and manufactures alike.

Alkoxylated glycols, their mono-methyl ether and mono-methyl ether acetate derivatives are included in the aqueous solution in amounts of 0.001 wt % to 2 wt % of the aqueous solution. Typically, the alkoxylated glycols, their mono-methyl ether and mono-methyl ether acetate derivatives are included in amounts of 0.1 wt % to 1 wt % of the aqueous solution. The alkoxylated glycols, their mono-methyl ether and mono-methyl ether acetate derivatives are non-cyclic but are linear or branched compounds. Alkoxylated glycols, their mono-methyl ether and mono-methyl ether acetate derivatives include, but are not limited to, compounds having a general formula:

$$RO(C_xH_{2x}O)_mY \qquad (I)$$

Wherein R is —CH$_3$ or —H, Y is —H or —C(O)CH$_3$, and m is an integer of 3 or greater, or such as from 8 to 66. Typically, m is an integer of 3 to 6, more typically from 3 to 5 and x is an integer of 3 to 6, or such as from 3 to 4. Typically R is —H and Y is —H. Examples of such alkoxylated glycols are tripropylene glycol, tetrapropylene glycol, polypropylene glycol, tributylene glycol, tetrabutylene glycol, polybutylene glycol, tripentylene glycol, tetrapentylene glycol and polypentylene glycol.

Alkoxylated glycols also include, but are not limited to, compounds having a general formula:

$$HO(CH_2CH_2O)_nH \qquad (II)$$

wherein n is an integer of 3 or greater, or such as from 5 to 200. Typically, n is an integer of 3 to 5, more typically from 3 to 4. Examples of such alkoxylated glycols are triethylene glycol, tetraethylene glycol and polyethylene glycol.

The aqueous texturing solutions also include one or more alkaline compounds. Such alkaline compounds include, but are not limited to, alkali metal hydroxides, such as potassium, sodium hydroxide and lithium hydroxide, and quaternary ammonium hydroxides, such as tetramethyl ammonium hydroxide, tetrapropyl ammonium hydroxide, tetrabutyl ammonium hydroxide, tetramethyl-2-hydroxylethyl ammonium hydroxide (choline), trimethyl-3-hydroxypropyl ammonium hydroxide, trimethyl-3-hydroxybutyl ammonium hydroxide, trimethyl-4-hydroxybutyl ammonium hydroxide, tritriethyl-2-hydroxylethyl ammonium hydroxide, tripropyl-2-hydroxyethyl ammonium hydroxide, tributyl-2-hydroxylethyl ammonium hydroxide, dimethylethyl-2-hydroxyethyl ammonium hydroxide, dimethyldi(2-hydroxyethyl ammonium hydroxide, monomethyltri(2-hydroxyethyl) ammonium hydroxide, monomethyltriethyl ammonium hydroxide, monomethyltripropyl ammonium hydroxide, monomethyltributyl ammonium hydroxide, monoethyltrimethyl ammonium hydroxide, monoethyltributyl ammonium hydroxide, dimethyldiethyl ammonium hydroxide and dimethyldibutyl ammonium hydroxide.

Other alkaline components include ammonium hydroxide, alkanolamines such as 2-aminoethanol (monoethanolamine), 1-amino-2-propanol, 1-amino-3-propanol, 2-(2-aminoethoxy)ethanol, 2-(2-aminoethylamino)ethanol. Other suitable alkaline compounds include 3-methoxypropylamine, morpholine, alkane diamines, such as 1,3-pentanedaimine and 2-methyl-1,5-pentanediamine, and guanidine.

Typically the alkaline compound included in the aqueous texturing solution is chosen from one or more hydroxides. More typically, the alkaline compound is chosen from one or more alkali metal hydroxides and alkyl ammonium hydroxides. Alkaline compounds are included in the aqueous texturing solutions in amounts of 0.5 wt % to 15 wt % of the aqueous solution. Typically, the alkaline compound is included in the aqueous texturing solution in amounts of 1 wt % to 10 wt %.

Optionally, the aqueous texturing solution may include one or more alkali metal chlorides, such as sodium and potassium chloride and one or more silicates, such as alkali metal silicates, such as the sodium and potassium silicates. Mixture of metal chlorides and metal silicates may be used. Such metal chlorides and metal silicates may be included in the aqueous solutions in amount of 0.01 wt % to 2 wt %, or such as from 0.5 wt % to 1 wt % of the aqueous solution.

In one embodiment the aqueous texturing solution consists essentially of one or more compounds chosen from alkoxylated glycols, their mono-methyl ether and mono-methyl ether acetate derivatives having a weight average molecular weight of 170 g/mole or greater and a flash point of 75° C. or greater, one or more alkaline compounds and water. In another embodiment, the aqueous texturing solution consists essentially of one or more compounds chosen from alkoxylated glycols, their mono-methyl ether and mono-methyl ether acetate derivatives having a weight average molecular weight of 170 g/mole or greater and a flash point of 75° C. or greater, one or more alkaline compounds, one or more compounds chosen from alkali metal chlorides and alkali metal silicates and water.

The aqueous texturing solutions may be applied to a surface of a semiconductor substrate by any suitable method known in the art. The aqueous texturing solutions are applied to a surface of the semiconductor substrate at temperatures of 70° C. or higher, typically from 80° C. to 200° C., or such as from 90° C. to 150° C. Typically, the aqueous texturing solutions are applied to a surface of the semiconductor substrate by horizontal or vertical processes. Such methods are well known in the art. Briefly, horizontal methods involve passing the semiconductor substrate on a conveyor system and spraying the aqueous solution on the surface of the substrate. In the vertical process the substrate is dipped in the aqueous texturing solution. Various conventional apparatus used for such processes are well known in the art.

The semiconductor substrates may be composed of monocrystalline or polycrystalline or amorphous silicon. Typically, the semiconductor substrate is monocrystalline or polycrystalline. The aqueous texturing solution is applied to a surface of the semiconductor substrate for dwell times of 5 min. to 40 min., typically from 10 min. to 30 min. The semiconductor substrate is then rinsed with water. The texturing method is anisotropic and forms uniform and repeatable pyramid (tetragonal) structures over the entire treated surface of the semiconductor substrate. The pyramid structures are randomly dispersed over the entire treated surface. The pyramid structures may range in height from 1 μm to 10 μm.

The semiconductors textured with the aqueous solution reduce reflectance from incident light applied to their textured surfaces. Reflectance of incident light in the 360 nm to 1000 nm wavelength range is from 7% to 20%. Typically, reflectance of incident light is from 12% to 15%. Reflectance may be measured using conventional reflectometers well known in the art. Accordingly, semiconductors textured by the method using the aqueous solutions are suitable for use in devices which convert incident light, such as light from sunlight, lasers, fluorescent light, as well as other sources of light, into electric energy. Such devices include, but are not limited to photovoltaic devices, such as solar cells, optical and electrochemical detectors/sensors, biodetectors/biosensors, catalysts, electrodes, gate electrodes, ohmic contacts, interconnection lines, Schottky barrier diode contacts and optoelectronic components.

Although the texturing method may be used to texture semiconductor substrates for various devices, typically, the texturing method is used in the manufacture of photovoltaic devices, such as solar cells. Photovoltaic devices and solar cells may be composed of monocrystalline or polycrystalline or amorphous silicon containing semiconductor wafers. Such wafers typically have a p-type base doping. However, texturing may be done on semiconductor wafers prior to any doping or other processing steps in the manufacture of photovoltaic devices. In general, texturing may be done at any convenient time during the manufacture of the photovoltaic device. Typically, the semiconductor substrate is textured before the doping process is complete.

The semiconductor substrates are typically wafers which may be circular, square or rectangular in shape or may be any other suitable shape. Such wafers may have a wide variety of dimensions and surface resistivities. For example, circular wafers may have a diameter of 150 nm, 200 nm, 300 nm, 400 nm, or greater.

The entire back side of the wafer may be metal coated or a portion of the back side may be metal coated, such as to form a grid. Such back side metallization may be provided by a variety of techniques, and may be done prior to the metallization of the front side of the wafer. In one embodiment, a metal coating is applied to the back side in the form of an electrically conductive paste, such as a silver-containing paste, an aluminum-containing paste or a silver and aluminum-containing paste; however, other suitable pastes known in the art also may be used. Such conductive pastes typically include conductive particles embedded in a glass matrix and an organic binder. Conductive pastes may be applied to the wafer by a variety of techniques, such as screen printing. After the paste is applied, it is fired to remove the organic binder. When a conductive paste containing aluminum is used, the aluminum partially diffuses into the back side of the wafer, or if used in a paste also containing silver, may alloy with the silver. Use of such aluminum-containing paste may improve the resistive contact and provide a "p+"-doped region. Heavily doped "p+"-type regions by previous application of aluminum or boron with subsequent interdiffusion may also be produced. Optionally, a seed layer may be deposited on the back side of the wafer and a metal coating may be deposited on the seed layer by electroless or electrolytic plating.

To produce the semiconductor junction, phosphorus diffusion or ion implantation takes place on the front side of the wafer to produce an n-doped (n+ or n++) region and provides the wafer with a PN junction. The n-doped region may be referred to as the emitter layer.

The front side or emitter layer of the wafer is subjected to texturing in order to impart to the surface an improved light incidence geometry which reduces reflections. The aqueous solution including one or more compounds chosen from alkoxylated glycols, their mono-methyl ether and mono-methyl ether acetate derivatives having a weight average molecular weight of 170 g/mole and a flash point of 75° C. or greater and one or more alkaline compounds is applied to the emitter layer for 10 min. to 30 min., typically from 10 min. to 15 min. to form uniform and randomly dispersed pyramid structures on the emitter layer. The aqueous texturing solutions have surface tensions of 64 dynes/cm or less and are readily applied to the wafer using conventional liquid applications apparatus such as spraying devices or just by immersion the wafer into the texturing solution. The temperature of the aqueous solution ranges from 80° C. to 110° C. After a dwell time of 10 min. to 30 min., the wafer is rinsed with water to remove the texturing solution.

An anti-reflective layer is added to the front side or emitter layer of the wafer. In addition the anti-reflective layer may serve as a passivation layer. Suitable anti-reflective layers include, without limitation, silicon oxide layers such as $SiO_x$, silicon nitride layers such as $Si_3N_4$, a combination of silicon oxide and silicon nitride layers, and combinations of a silicon oxide layer, a silicon nitride layer with a titanium oxide layer such as $TiO_x$. In the foregoing formulae, x is an integer representing the number of oxygen atoms. Such anti-reflective layers may be deposited by a number of techniques, such as by various vapor deposition methods, for example, chemical vapor deposition and physical vapor deposition.

The front side of a wafer contains a metallized pattern. For example, the front side of a wafer may be composed of current collecting lines and current busbars. Current collecting lines are typically transverse to the busbars and typically have a relatively fine-structure (i.e. dimensions) relative to current busbars.

The pattern reaches through the antireflective layer to expose the surface of the semiconductor body of the wafer. Alternatively trenches may be formed in the openings to create a selective emitter. These trenches may be regions of high doping. A variety of processes may be used to form the pattern, such as, but not limited to, laser ablation, mechanical means, and lithographic processes, all of which are well known in the art. Such mechanical means include sawing and scratching. Typical photolithographic processes include disposing an imageable material on the surface of the wafer, patterning the imageable material to form openings in the anti-reflective layer, transferring the pattern to the wafer, depositing a nickel layer in the openings and removing the imageable material. In one embodiment, the imageable material is removed before the step of depositing a metal layer in the openings. In another embodiment, the imageable material is removed after the step of depositing a metal layer in the openings. When the imageable material is present during the metal deposition step, such imageable material typically avoids any dyes, such as contrast dyes, that absorb in the wavelength of radiation used during the nickel deposition step. Imageable material present during the plating step typically contains a dye which has a minimum light transmittance of 40-60%.

The imageable material may be removed using any suitable polymer remover. Such removers may be alkaline, acidic or essentially neutral and are well known in the art.

In one embodiment, the front side of the wafer may be metallized using a conductive paste, which may be the same as or different from any conductive paste used on the rear side of the wafer. Any conductive paste used to metallize the front side of a wafer typically does not contain aluminum. The temperature used in the firing of the paste depends on the particular paste used, the thickness of any antireflective layer used, among other factors. The choice of such temperature is well within the ability of those skilled in the art. Also, it is appreciated by those skilled in the art that the firing process may be performed in an oxygen-containing atmosphere, an inert atmosphere, a reducing atmosphere, or a combination of any of these. For example, the firing may be performed at a first temperature in an atmosphere containing little oxygen and then at a second temperature under an inert atmosphere or under a reducing atmosphere, where the second temperature is higher than the first temperature.

Following the firing process, the wafer may optionally be contacted with a buffered acid solution, such as a buffered hydrofluoric acid solution, to remove any oxide produced during the firing procedure. Such contact may be by spraying the solution on the wafer or by dipping the wafer into such solution or by any other suitable means.

After the front side pattern and rear side of the wafer are metallized using conductive paste, a layer of metal is then deposited on the front side conductive pattern. Such layer of metal may be any suitably conductive metal such as gold, silver or copper, and is typically silver. Such metals may be deposited by methods known in the art. In one embodiment, the deposited metal layer is composed of the same metal used in the conductive paste. For example, a silver layer is deposited on a silver-containing conductive paste.

Silver may deposited by light induced plating (LIP) or conventional silver electroplating methods well known in the art. When LIP is used, the rear side of the semiconductor wafer is connected to a source of external current (rectifier). A silver anode placed in the silver plating composition is connected to the rectifier such that a completed circuit is formed between the components. Typical current densities are from $0.1 A/dm^2$ to $5 A/dm^2$. The total current requirement is dependent upon the particular size of the wafer used. Additionally, the silver anode provides a ready source of silver ions to replenish the silver plating composition with silver ions without the need to use an external source. A light source is positioned to illuminate the semiconductor wafer with light energy. The light source can be, for example, a fluorescent or LED lamp which provides energy within the wavelengths to which the semiconductor wafer is photovoltaically sensitive. A variety of other light sources may be used, such as, but not limited to, incandescent lamps such as a 75 watt and 250 watt lamps, mercury lamps, halogen lamps and a 150 watt IR lamp. Examples of commercially useful silver plating compositions are available as ENLIGHT™ Silver Plate 600 and 620 from Rohm and Haas Electronic Materials, LLC Marlborough, Mass.

The plating cell is of such a material as to be chemically inert with respect to the silver plating composition and has a minimum light transmittance of 40-60%. Alternatively, the wafer can be positioned horizontally in the plating cell and illuminated from above the silver plating composition, in which case the plating cell need not have at least the minimum light transmittance.

In another embodiment a metal seed layer may be deposited on the front side conductive pattern instead of a metal paste. Typically the metal seed layer is nickel. The nickel seed layer may be deposited by any conventional nickel deposition method known in the art. Typically, the nickel seed layer is deposited by light assisted nickel deposition. If the source of the nickel is an electroless nickel composition, plating is done without application of external current. If the source of the nickel is from an electrolytic nickel composition, a rear side potential (rectifier) is applied to the semiconductor wafer substrate. The light may be continuous or pulsed. Prior to depositing nickel, surface oxides are typically removed from the conductive pattern using a solution of 1% hydrofluoric acid.

Light which may be used in the plating process includes, but is not limited to, visible light, IR, UV and X-rays. Light sources include, but are not limited to, incandescent lamps, LED lights (light emitting diodes), infrared lamps, fluorescent lamps, halogen lamps and lasers. In general the amount of light applied to the semiconductor may be 8000 lx to 20,000 lx.

Typically, nickel is deposited through the openings in the anti-reflective layer and onto the exposed textured surface of the semiconductor wafer using an electroless nickel plating composition. Examples of commercially available electroless nickel compositions include DURAPOSIT™ SMT 88 Electroless Nickel and NIPOSIT™ PM 980 and PM 988 Electroless Nickel. All are available from Rohm and Haas Electronic Materials, LLC, Marlborough, Mass., U.S.A.

Alternatively, electrolytic nickel compositions may be used. When an electrolytic composition is used, an applied rear side potential (rectifier) is used in addition to light to deposit the nickel. Typical current densities are from 0.1 A/dm$^2$ to 2 A/dm$^2$. The particular current requirement is dependent upon the particular size of the wafer used. The electroplating processes used are conventional. Suitable electrolytic nickel plating baths are commercially available as well as many which are disclosed in the literature. Examples of commercially available electrolytic nickel baths are the NICKEL GLEAM™ Electrolytic Nickel products obtainable from Rohm and Haas Electronic Materials, LLC.

By illuminating the front of the semiconductor wafer with light energy, plating occurs on the front. The impinging light energy generates a current in the semiconductor. The rate of plating on the front is controllable by adjusting the light intensity, bath temperature, reducing agent activity, starting wafer conditions, doping level as well as other parameters which are known to workers in the art. If the plating bath is an electrolytic bath the rate of plating may also be adjusted by the rectifier. A nickel layer of 20 nm to 300 nm thickness is typically desired, with the exact thickness depending on various factors such as on the application, size, pattern and geometry.

After the nickel is deposited through the openings and adjacent to the exposed surface of the semiconductor wafer substrate, silver is then deposited adjacent to the nickel. Conventional electroplating silver compositions may be used. The silver compositions may be cyanide containing silver compositions or cyanide-free silver compositions.

Silver may deposited on the nickel by light induced plating (LIP) or conventional silver electroplating methods well known in the art. The procedure of LIP plating is similar to that for plating the silver paste described above. A silver layer of 1 μm to 30 μm thickness is typically desired, with the exact thickness depending on various factors such as on the application, size, pattern and geometry.

After the silver metal is deposited onto and adjacent the nickel, the semiconductor is then sintered to form nickel silicide. Sintering is done with the silver deposited onto the nickel surface to improve adhesion between the silver and nickel. The improved bonding between the nickel and the silicon reduces the probability of adhesion failure between the nickel silicide and the silver. Further, silver is not incorporated into the silicide by the sintering temperatures, thus nickel silicide is formed with the silver protecting the nickel from oxidation during sintering. A furnace providing a wafer peak temperature of 380° C. to 550° C. may be used. Typically, peak temperature times range from 2 seconds to 20 seconds. An example of a suitable furnace is a lamp based furnace (IR).

Since the silver layer protects the nickel from oxidation during sintering, sintering may be done in oxygen containing environments as well as inert gas atmosphere or vacuum. In general, sintering is done for 3 min. to 10 min. Line speeds at which the semiconductor passes through the furnace may vary depending on the furnace used. Minor experimentation may be done to determine the appropriate line speed. Typically, the line speed is from 330 cm/minute to 430 cm/minute.

The surfaces of the semiconductors textured with the aqueous solutions described above provide semiconductors which reduce the reflectance of incident light in contrast to many conventional methods of forming pyramid structures. This increases the amount of incident light absorbed by the semiconductor and improves the efficiency of converting light into electrical energy.

The following examples are included to illustrate the invention but are not intended to limit the scope of the invention.

EXAMPLE 1

A doped monocrystalline silicon wafer having an n+ doped zone on the front side or emitter layer and a pn-junction below the emitter layer was sprayed with an aqueous texturing solution having the formula disclosed in Table 1 below.

TABLE 1

| COMPONENT | AMOUNT |
|---|---|
| Tripropylene glycol[1] | 0.5 wt % |
| Potassium hydroxide | 6 wt % |
| Sodium chloride | 0.5 wt % |
| Water | 93 wt % |

[1]weight average molecular weight = 192 g/mole
flash point = 140.5° C.
Boiling point = 268° C.

The aqueous texturing solution was applied to the wafer at 90° C. and the dwell time was 15 min. After 15 min. the aqueous texturing solution was rinsed with water and allowed to dry at room temperature.

The surface of the treated emitter layer was then examined for the quality of texturing. The surface was examined using a scanning electron microscope (AMRAY 1510 Filed Emission scanning electron microscope). The results showed both random and uniform tetrahedral pyramid structures over the entire surface of the emitter layer. This is shown in FIG. 1 which is a SEM at 200× of the textured surface. Peak height distribution was also good and the majority of peaks ranged from 6.5 μm to 8 μm with minor amounts in the 1 μm to 3 μm range.

Reflectance of the textured surface was then taken using a MacBeth Coloreye Reflectometer 7000 in the wavelength range of 360 nm to 750 nm. The source of the incident light was a pulsed xenon bulb. An average of 6 reflectance readings was taken across the surface. The reflectance ranged from 13% to 15% with an average of 14%. The average reflectance was in the ideal range of 13% to 14%.

EXAMPLE 2

The method described in Example 1 was repeated except that dipropylene glycol was substituted for tripropylene glycol. The aqueous texturing solution had the formulation shown in Table 2 below.

TABLE 2

| COMPONENT | AMOUNT |
|---|---|
| Dipropylene glycol[2] | 0.5 wt % |
| Potassium hydroxide | 6 wt % |
| Sodium chloride | 0.5 wt % |
| Water | 93 wt % |

[2]weight average molecular weight = 134.18 g/mole
Flash point = 138° C.
Boiling point = 232° C.

The aqueous texturing solution was applied to the wafer at 90° C. and the dwell time was 15 min. After 15 min. the aqueous texturing solution was rinsed with water and allowed to dry at room temperature.

Figure 2:
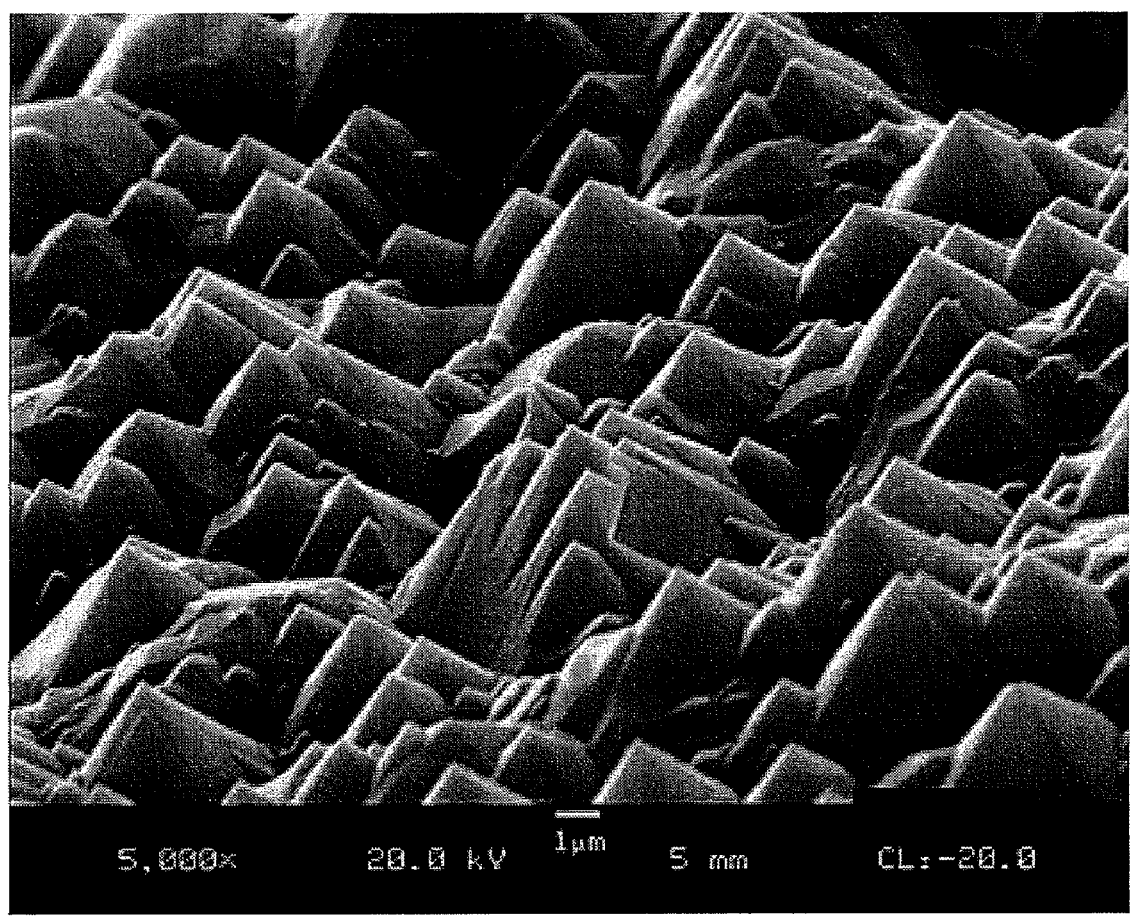
FIG. 2 is a 5000×SEM of a textured surface of a polysilicon wafer showing pyramid structures formed with an alkaline solution of low flash point glycol.

The surface of the treated emitter layer was then examined for the quality of texturing. The surface was examined using a scanning electron microscope. Although there was random distribution of pyramid structures, the pyramid structures were not uniform over the entire surface of the emitter layer. FIG. 2 is a SEM of the textured surface. Further, there were many planar areas. Lack or uniformity of the pyramid structures and planar areas increased reflectance of incident light in comparison to the textured surface of Example 1. Peak height distribution was poor in contrast to that of Example 1. A majority of peak distribution ranged from 2 μm to 8 μm with some in the 10 μm to 12 μm. This broad distribution of peak heights also resulted in increased reflectance. The average reflectance was 27% in the 360 nm to 750 nm range as measured using the MacBeth Coloreye Reflectometer 7000.

What is claimed is:

1. A method comprising:
a) providing a semiconductor substrate; and
b) applying an aqueous solution comprising one or more compounds chosen from alkoxylated glycols, their mono-methyl ether and mono-methyl ether acetate derivatives comprising a molecular weight of 170 g/mole or greater and a flash point of 75° C. or greater, and one or more alkaline compounds to the semiconductor substrate to texture the semiconductor substrate.

2. The method of claim 1, wherein the one or more compounds chosen from alkoxylated glycols, their mono-methyl ether and mono-methyl ether acetate derivatives have a formula:

$$RO(C_xH_{2x}O)_mY \quad (I)$$

wherein R is —CH$_3$ or —H, Y is —H or —C(O)CH$_3$, and m is an integer of 3 or greater and x is an integer of 3 to 6.

3. The method of claim 1, wherein the alkoxylated glycols have a formula:

$$HO(CH_2CH_2O)_nH \quad (II)$$

wherein n is an integer of 3 or greater.

4. The method of claim 1, wherein the one or more alkaline compounds are chosen from hydroxides and alkanolamines.

5. The method of claim 1, further comprising one or more alkali metal chlorides or one or more silicates, or mixtures thereof.

6. A method comprising:
a) providing a semiconductor substrate;
b) texturing a surface of the semiconductor substrate with an aqueous solution comprising one or more compounds chosen from alkoxylated glycols, their mono-methyl ethers and mono-methyl ether acetate derivatives comprising a molecular weight of 170 g/mole or greater and a flash point of 75° C. or greater, and one or more bases;
c) doping the semiconductor substrate to provide a p/n junction;
d) depositing an anti-reflective layer on the textured surface;
e) selectively etching the anti-reflective layer to expose portions of the textured surface to form a pattern; and
f) depositing one or more metal layers on the exposed portions of the textured surface.

7. The method of claim 6, wherein the one or more metal layers is gold, silver, copper or nickel.

8. The method of claim 6, wherein the silicon containing substrate is a photovoltaic device, electrodes, ohmic contact, interconnection line, Schottky barrier diode contact, an optoelectronic component, components for optical and electrochemical detectors/sensors, catalysts, ohmic contacts, and interconnection lines.

9. An aqueous texturing solution consisting essentially of one or more compounds chosen from alkoxylated glycols, their mono-methyl ether and mono-methyl ether acetate derivatives having a weight average molecular weight of 170 g/mole or greater and a flash point of 75° C. or greater, one or more alkaline compounds and water.

* * * * *